& Garrett

United States Patent [19]

Sumi

[11] 4,181,860
[45] Jan. 1, 1980

[54] RADIANT BEAM EXPOSURE METHOD
[75] Inventor: Masahiko Sumi, Yokohama, Japan
[73] Assignee: Vlsi Technology Research Association, Japan
[21] Appl. No.: 873,885
[22] Filed: Jan. 31, 1978
[30] Foreign Application Priority Data
  Jan. 31, 1977 [JP] Japan .................... 52-8806
[51] Int. Cl.² .......................................... H01J 37/00
[52] U.S. Cl. ............................... 250/492 A; 250/398
[58] Field of Search ............ 250/492 A, 398, 396 R; 156/655; 313/359, 421

[56] References Cited
U.S. PATENT DOCUMENTS 3,900,736  4/1975  Michail et al. .................. 250/492 A
4,051,381  9/1977  Trotel .............................. 250/492 A
4,063,103  12/1977  Sumi ............................... 250/492 A

*Primary Examiner*—Bruce C. Anderson
*Attorney, Agent, or Firm*—Finnegan, Henderson, Farabow & Garrett

[57] ABSTRACT

A radiant beam exposure method is provided in which an IC pattern is depicted on a semiconductor pellet with the IC pattern being divided into a plurality of pattern sections. Each of the pattern sections is depicted with a number of scanning lines traversing it. Each of the scanning lines corresponds to a train of bits representing a part of the pattern section. The pattern bit train is provided at at least one end with a bit representing jointing portion. The jointing bit is used to joint divided pattern sections.

7 Claims, 13 Drawing Figures

RADIANT BEAM EXPOSURE METHOD

BACKGROUND OF THE INVENTION

The invention relates to a radiant beam exposure method and, more particularly, to the one for depicting an IC pattern on a semiconductor pellet.

An electron beam is used to depict an IC pattern on a semiconductor pellet. In this case, the electron beam is blanked or unblanked depending on the pattern information. Black of the pattern is represented by a binary "1" and white by a binary "0".

The depicting range the electron beam is defined by the scanning range of it in several mm or less. Nevertheless, the size of the pattern to be depicted touches even 10 cm$^2$. For this, a pattern is depicted on the IC pellet with the pattern being divided into a number of rectangular or square sections, when the pattern is depicted. In this case, when the black pattern portion continuously extends over two adjacent sections, the divided pattern sections must be correctly joined together in the pattern depiction. When the divided pattern sections are jointed, the IC pellet is positioned with a high accuracy and any remaining inaccuracy in the positioning is corrected by using a laser interferometer associated with a feedback system. The accuracy of the pattern positioning attained through such positioning is in the order of 0.2 $\mu$m. The error of 0.2 $\mu$m is caused by several things. One of them is that the unit of the laser measuring is quantitized at, for example, 0.08 $\mu$m. Another is that the moving mechanism is subjected to temperature variation. Still another is that the electron beam is accompanied by positioning drift. These factors make it impossible to completely eliminate the error. Due to the error, joining between adjacent divided pattern sections is incorrectly made, with the result that there arises disconnection in wiring of the IC. One of the countermeasures to avoid this defect is to depict the pattern on a relatively large size. This method, however, is defective in that, when the divided pattern sections are jointed, the pattern at the jointed portion is smaller than that at the central portion of the depicted pattern section.

SUMMARY OF THE INVENTION

Accordingly, an object of the present invention is to provide a radiant beam exposure method in which the divided pattern sections are well jointed in a correct alignment.

In a radiant beam exposure method of the present invention, a pattern to be depicted is divided into a plurality of pattern sections. Each of the pattern sections is provided at least one end with a jointing portion.

Other objects and advantages of the invention will be apparent from the following discussion of the accompanying drawings, in which:

BRIEF DESCRIPTION OF THE DRAWINGS

FIGS. 5A and 5B show formats of the pattern information bit trains corresponding to scanning lines which a pattern condition at the jointing portion of each scanning line is different;

DETAILED DESCRIPTION OF THE PREFERRED EMBODIMENTS

Figure 1:
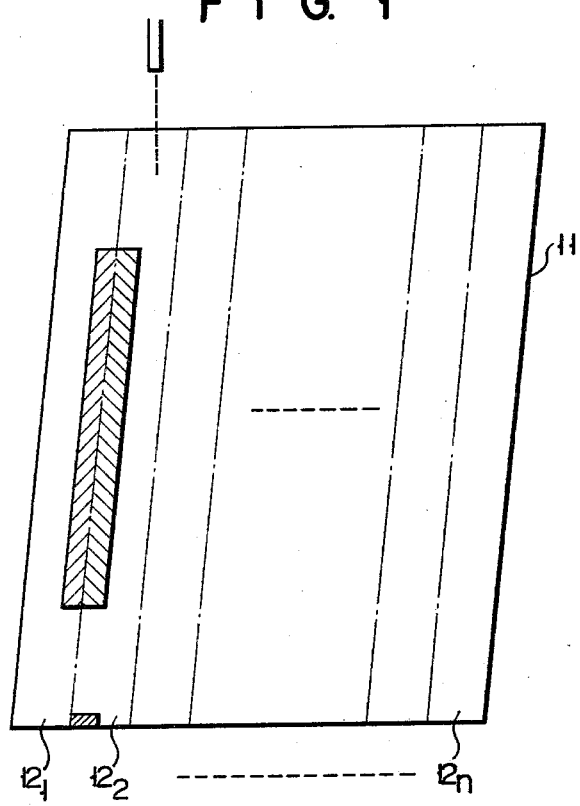
FIG. 1 generally illustrates how to depict an IC pattern on a semiconductor pellet.

When depicting on a semiconductor chip (pellet) 11, and IC (integrated circuit) pattern is divided into a plurality of pattern sections, as shown in FIG. 1. The details of the IC pattern depiction is disclosed in allowed U.S. Pat. application Ser. No. 675,178 invented by the inventor of the present application. In the depiction of the IC pattern, the divided pattern sections are each converted into a number of pattern information bit trains corresponding to a number of scanning lines by which the pattern section is depicted on the semiconductor chip. That is, each of the pattern information bit trains represents the pattern information corresponding to the pattern depicted by one scanning line and comprises a combination of binary digits "1" and "0". These bit trains are stored in a memory and, when the pattern is depicted, are read out therefrom to drive a blanking circuit. The blanking circuit produces a blanking signal corresponding to the pattern information of the bit train to be applied to a charged beam radiating apparatus. In the radiating apparatus, an electron beam deflected by a deflecting signal and blanked in accordance with the information of the bit train thereby to depict the pattern included in the bit train on the semiconductor chip.

Figure 2:
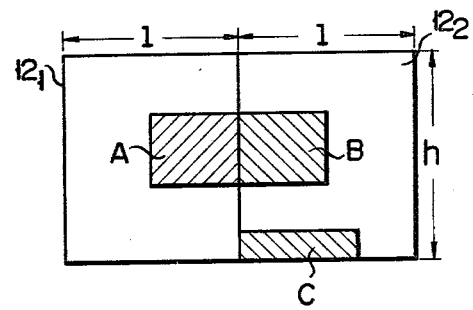
FIG. 2 illustrates an ideal jointing state between adjacent pattern sections.
Figure 3:
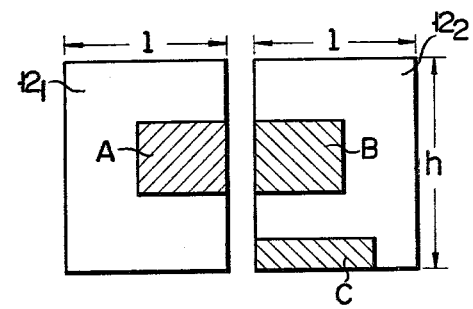
FIG. 3 illustrates a state that adjacent divided pattern sections are separately disposed.
Figure 4:
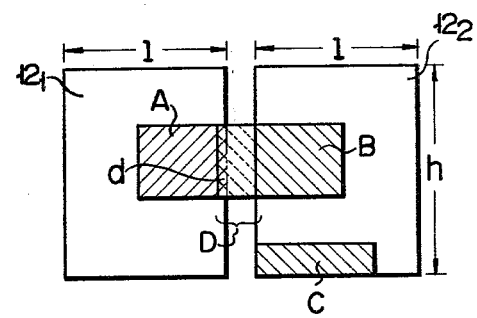
FIG. 4 illustrates a state that adjacent separated pattern sections are jointed by using a jointing portion according to the present invention.

In this manner, the pattern sections are successively depicted on the chip. In this case, the adjacent pattern sections must be well jointed in correct alignment. Referring now to FIG. 2, there is shown pattern sections 12$_1$ and 12$_2$ including black pattern portions A and B, respectively, which portions are ideally jointed. In the figure, a black portion C indicates a pattern belonging to only one section and not extending over both the sections 12$_1$ and 12$_2$. Turning now to FIG. 3, two pattern sections 12$_1$ and 12$_2$ are depicted separately and thus black pattern portions A and B are separated. When the IC pattern is separated as shown in FIG. 3, there arises disconnection in wiring. The pattern illustrated in FIG. 4 is that separately depicted black pattern portions A and B are connected by a jointing pattern portion D. In FIG. 4, it is assumed that an electron beam is horizontally scanned. Further, assume that the width 1 of the pattern section is 250 $\mu$m corresponding to 250 binary digits and that the height thereof is about 10 cm.

FIG. 5 shows a format of the pattern information of one scanning line which belongs to the pattern section 12$_2$ including the black pattern portion B and the jointing portion D. The pattern information across the pattern portion B included in the pattern section 12$_2$ is expressed by 250 bits from the 7th to 256th bits. The black pattern portion B is represented by "1" and the white pattern portion by "0". The 6th bit is used to express a condition of the jointing portion D. In this case, the black pattern portion A in the pattern section $12_1$ must be connected with that of the black pattern portion B of the pattern section $12_2$ so that the jointing portion D must be represented by the same bit as those of the black pattern portions A and B, i.e. "1", as shown in FIG. 5A.

FIG. 5B shows a format of a pattern information of one scanning line across the black pattern portion C of the pattern section $12_2$. In this case, no jointing portion is necessary so that this state is represented by "0", as shown in the bit of FIG. 5B. When entire surface of the IC pattern is divided into a number of pattern sections each with height h and width l, the pattern corresponding to one scanning line and the jointing portion are converted into the binary information. In other words, 251 bits are used to express the pattern information of the width. In this manner, separated pattern portions A and B as shown in FIG. 3 are jointed.

In FIG. 4, part of the jointing portion D lapped on the pattern portion A is an overlapping part d. As mentioned above, the width l of the pattern section corresponds to 250 bits and the jointing portion D corresponds to 1 bit. In the figure, the width of the jointing portion is relatively largely depicted for exaggeration.

Figure 6:
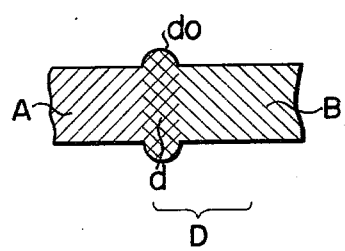
FIG. 6 illustrates a pattern at the jointing portion when adjacent pattern sections are jointed according to the present invention.

It is obvious that the jointing portion D should not exceed one bit length. An experiment showed that, when the overlapping portion d is 1 $\mu$m, the exposure at the doubly exposed part is excessive with a swelled portion $d_0$ formed thereat, as shown in FIG. 6. Accordingly, it is preferable that the overlapping part d is as small as possible, so far as the necessary positioning accuracy is ensured. The experiment also showed that the preferable width of the overlapping part is 0.5 $\mu$m, i.e. 0.5 bit. The pattern information bit train corresponding to one scanning line isobtained through a shift register shifting in series fashion. In this case, the clock for shifting the shift register is made to correspond to one bit. Therefore, it is impossible to obtain the length of the half bit.

Figure 7:
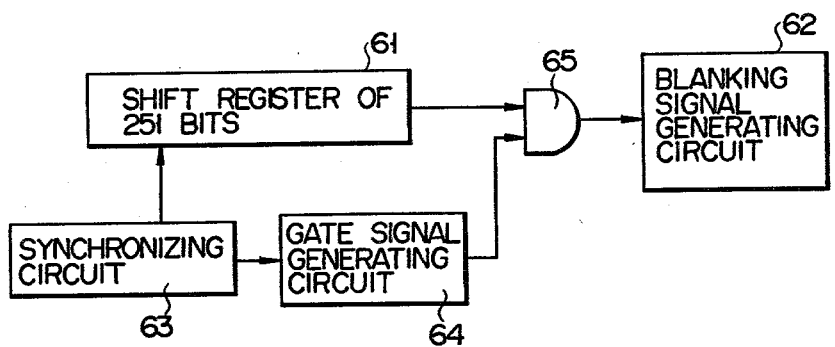
FIG. 7 shows a block diagram of a circuit for controlling the width of the jointing portion.

Referring now to FIG. 7, there is shown a circuit for solving such a problem. In the figure, outputs of a 251 bit shift register 61 and a gate signal generating circuit 64 are coupled with inputs of an AND gate 65 of which the output is connected to a beam blanking circuit 62. A synchronous circuit 63 is coupled with the shift register 61 and the gate signal generating circuit 64. The output signals of the shift register 61 and the gate signal generating circuit are gated by the AND gate 65 and the output signal of the AND gate 65 is applied to the blanking circuit 62. The synchronous circuit 63 synchronizes the shift register 61 with the gate signal generator 64 and an electron beam deflection means (not shown).

Figure 8:
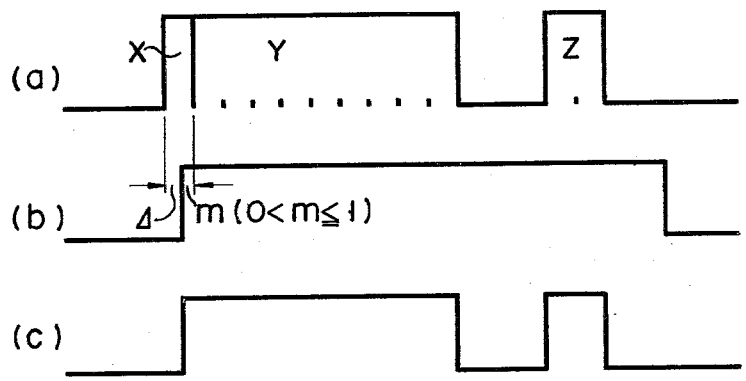
FIG. 8 shows a set of waveforms of signals of the circuit of FIG. 7 for illustrating the operation of the FIG. 7 circuit.

FIG. 8 shows a set of waveforms for illustrating the operation of the circuit shown in FIG. 7. A signal a is outputted from the shift register 61 in which the high level corresponds to the black pattern portion. At the high level, the electron beam is turned on. A signal b is a gate signal from the gate signal generating circuit 64. An output signal of the AND gate 65 is denoted as c. The portion X of the signal a is the jointing information. The portions Y and Z correspond to the pattern. The jointing portion D is properly adjusted by properly setting up the rise time of the signal b, i.e. the time difference between the rise times of the signals a and b. In FIG. 8, m indicates the width of the jointing portion D.

Figure 9:
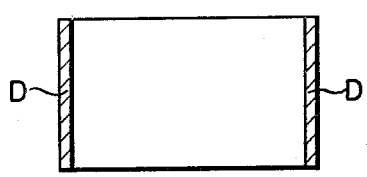
FIGS. 9 to 12 illustrate various types of jointing portions according to the present invention.
Figure 10:
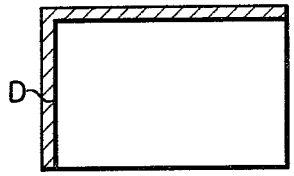
Figure 11:
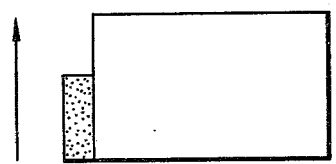
Figure 12:
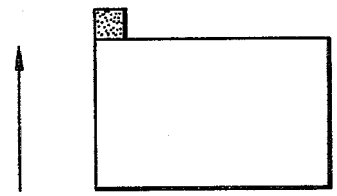

In the above-mentioned embodiment, the jointing portion is attached to the left end of the pattern. However, the jointing portion may be placed at the right end of the pattern section. Additionally, the jointing portions may be disposed at the right and left ends of the pattern section, as shown in FIG. 9. When the present invention is applied to a vector scan type or one stroke transfer type exposure apparatus, the jointing portion may be used continuously extending over the left and upper sides of the pattern section, as shown in FIG. 10. The jointing portion may be disposed around the pattern section.

Instead of the gate signal for obtaining the half bit length, the shifting rate of the shift register may be doubled only for the scanning speed at the joining portion.

In the above embodiment, the same amount of exposure of electron beam onto the jointing portion D is employed. As shown in FIG. 10, the exposure amount may be adjusted by changing the intensity of the electron beam or the scanning speed. This method provides an improved jointing of the pattern sections. Further, if the separation between the pattern sections is very small, such the pattern sections may be jointed by increasing the exposure amount at the jointing portion, i.e. due to a proximity effect. An additional circuit may be used for changing the exposure amount in accordance with the diameter of an electron beam for depicting the jointing portion D having a width m, through an external computer.

As described above, in the present invention, a pattern to be depicted is divided into two or more pattern sections. The pattern sections are in turn depicted on the semiconductor chip by an electron beam. These depicted pattern sections are gathered together to form an entire pattern. A jointing portion is attached to at least one side of the pattern section in contact with adjacent pattern sections. In gathering, adjacent pattern sections are jointed through the jointing portion. Use of the jointing portion solves the jointing problem which has been serious in this field.

What is claimed is :

1. A radiant beam exposure method for depicting a given pattern by a number of scanning lines of a radiant electron beam comprising the steps of:
dividing the given pattern into a number of pattern sections, converting each of the pattern sections into a plurality of pattern information bit trains which correspond to the scanning lines, respectively, and are each provided at least one end with a jointing information bit;
storing into a memory device pattern information corresponding to the given pattern in the form of said pattern information bit trains;
selectively reading out the pattern information stored;
converting the pattern information bit trains of the pattern information read out into a blanking signal; and
applying the blanking signal into radiant beam emitting means whereby the radiant electron beam is controlled by the blanking signal and a jointing portion corresponding to the jointing information bit is formed at least one end of the pattern section depicted by the electron beam scanning, the jointing portion ensuring jointing between adjacent pattern sections.

2. A radiant beam exposure method according to claim 1, in which said pattern information bit train is comprised of a number of binary digits disposed in accordance with the pattern corresponding to one scanning line.

3. A radiant beam exposure method according to claim 1, in which said jointing information bit provides a jointing pattern in response to binary digit "1" or "0".

4. A radiant beam exposure method according to claim 1, in which the pattern corresponding to one scanning line includes a number of pattern elements, said pattern information bit train is comprised of a plurality of pattern information bits of which the number corresponds to the length of the scanning line, and the width of said jointing portion formed in response to said jointing information bit is narrower than that of one of the pattern elements formed in response to one of said pattern information bits.

5. A radiant beam exposure method according to claim 4, in which the width of said jointing portion is set up ½ of that of said pattern element.

6. A radiant beam exposure method according to claim 1, in which said jointing portion is formed by increasing the exposure amount of the radiant beam emitted from said radiant beam emitting means in response to said jointing information bit.

7. A radiant beam exposure method according to claim 1, in which said jointing portion is formed by a scanning line whose scanning speed is doubled in response to said jointing information bit.

* * * * *

UNITED STATES PATENT AND TRADEMARK OFFICE
CERTIFICATE OF CORRECTION

PATENT NO. : 4,181,860

DATED : January 1, 1980

INVENTOR(S) : Masahiko Sumi

It is certified that error appears in the above-identified patent and that said Letters Patent are hereby corrected as shown below:

Column 4, line 51, insert --at-- between "provided" and "at least"

Column 4, Line 65, insert --at-- between "formed" and "at least"

Signed and Sealed this

Twenty-fifth Day of March 1980

[SEAL]

Attest:

SIDNEY A. DIAMOND

Attesting Officer

Commissioner of Patents and Trademarks